US009171608B2

(12) United States Patent  
Xie et al.

(10) Patent No.: US 9,171,608 B2  
(45) Date of Patent: Oct. 27, 2015

(54) THREE-DIMENSIONAL (3D) MEMORY CELL SEPARATION AMONG 3D INTEGRATED CIRCUIT (IC) TIERS, AND RELATED 3D INTEGRATED CIRCUITS (3DICS), 3DIC PROCESSOR CORES, AND METHODS

(71) Applicant: QUALCOMM Incorporated, San Diego, CA (US)

(72) Inventors: Jing Xie, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/939,274

(22) Filed: Jul. 11, 2013

(65) Prior Publication Data

US 2014/0269022 A1    Sep. 18, 2014

Related U.S. Application Data

(60) Provisional application No. 61/800,220, filed on Mar. 15, 2013.

(51) Int. Cl.
  *G11C 5/06*     (2006.01)
  *G11C 11/412*   (2006.01)
  *G11C 5/02*     (2006.01)
  (Continued)

(52) U.S. Cl.
  CPC ............. *G11C 11/412* (2013.01); *G11C 5/025* (2013.01); *H01L 27/0688* (2013.01); *H01L 27/1108* (2013.01); *H01L 27/1116* (2013.01)

(58) Field of Classification Search
  CPC ........................................................ G11C 5/06

USPC ............................................................ 365/51
See application file for complete search history.

(56) References Cited

U.S. PATENT DOCUMENTS 5,606,186 A    2/1997    Noda
5,636,125 A    6/1997    Rostoker et al.
5,724,557 A    3/1998    McBean, Sr.
(Continued)

FOREIGN PATENT DOCUMENTS

EP    1432032 A2    6/2004
EP    2551898 A1    1/2013
(Continued)

OTHER PUBLICATIONS

Co-pending U.S. Appl. No. 13/784,915, filed Mar. 5, 2013.
(Continued)

*Primary Examiner* — Min Huang
(74) *Attorney, Agent, or Firm* — Withrow & Terranova, PLLC (57) ABSTRACT

A three-dimensional (3D) memory cell separation among 3D integrated circuit (IC) (3DIC) tiers is disclosed. Related 3DICs, 3DIC processor cores, and methods are also disclosed. In embodiments disclosed herein, memory read access ports of a memory block are separated from a memory cell in different tiers of a 3DIC. 3DICs achieve higher device packing density, lower interconnect delays, and lower costs. In this manner, different supply voltages can be provided for the read access ports and the memory cell to be able to lower supply voltage for the read access ports. Static noise margins and read/write noise margins in the memory cell may be provided as a result. Providing multiple power supply rails inside a non-separated memory block that increases area can also be avoided.

17 Claims, 6 Drawing Sheets

(51) Int. Cl.
*H01L 27/06* (2006.01)
*H01L 27/11* (2006.01)

(56) References Cited

U.S. PATENT DOCUMENTS

| | | | |
|---|---|---|---|
| 6,040,203 A | 3/2000 | Bozso et al. | |
| 6,125,217 A | 9/2000 | Paniccia et al. | |
| 6,260,182 B1 | 7/2001 | Mohan et al. | |
| 6,295,636 B1 | 9/2001 | Dupenloup | |
| 6,305,001 B1 | 10/2001 | Graef | |
| 6,374,200 B1 | 4/2002 | Nakagawa | |
| 6,448,168 B1 | 9/2002 | Rao et al. | |
| 6,627,985 B2 | 9/2003 | Huppenthal et al. | |
| 6,727,530 B1 | 4/2004 | Feng et al. | |
| 6,754,877 B1 | 6/2004 | Srinivasan | |
| 6,834,380 B2 | 12/2004 | Khazei | |
| 6,846,703 B2 | 1/2005 | Shimoda et al. | |
| 6,965,527 B2 | 11/2005 | Fasoli et al. | |
| 6,979,630 B2 | 12/2005 | Walitzki | |
| 7,107,200 B1 | 9/2006 | Korobkov | |
| 7,173,327 B2 | 2/2007 | Siniaguine | |
| 7,209,378 B2 | 4/2007 | Nejad et al. | |
| 7,280,397 B2 | 10/2007 | Scheuerlein | |
| 7,288,418 B2 | 10/2007 | Barge et al. | |
| 7,298,641 B2 | 11/2007 | Madurawe | |
| 7,356,781 B2 | 4/2008 | Koeder et al. | |
| 7,459,716 B2 | 12/2008 | Toda et al. | |
| 7,546,571 B2 | 6/2009 | Mankin et al. | |
| 7,579,654 B2 | 8/2009 | Couillard et al. | |
| 7,622,955 B2 | 11/2009 | Vilangudipitchai et al. | |
| 7,653,884 B2 | 1/2010 | Furnish et al. | |
| 7,663,620 B2 | 2/2010 | Robertson et al. | |
| 7,669,152 B1 | 2/2010 | Tcherniaev et al. | |
| 7,796,092 B2 | 9/2010 | Holly et al. | |
| 7,877,719 B2 | 1/2011 | He | |
| 7,964,916 B2 | 6/2011 | Or-Bach et al. | |
| 7,969,193 B1 | 6/2011 | Wu et al. | |
| 7,989,226 B2 | 8/2011 | Peng | |
| 8,006,212 B2 | 8/2011 | Sinha et al. | |
| 8,026,521 B1 | 9/2011 | Or-Bach et al. | |
| 8,046,727 B2 | 10/2011 | Solomon | |
| 8,059,443 B2 | 11/2011 | McLaren et al. | |
| 8,060,843 B2 | 11/2011 | Wang et al. | |
| 8,114,757 B1 | 2/2012 | Or-Bach et al. | |
| 8,115,511 B2 | 2/2012 | Or-Bach | |
| 8,136,071 B2 | 3/2012 | Solomon | |
| 8,146,032 B2 | 3/2012 | Chen et al. | |
| 8,164,089 B2 | 4/2012 | Wu et al. | |
| 8,208,282 B2 | 6/2012 | Johnson et al. | |
| 8,218,377 B2 | 7/2012 | Tandon et al. | |
| 8,222,696 B2 | 7/2012 | Yamazaki et al. | |
| 8,230,375 B2 | 7/2012 | Madurawe | |
| 8,258,810 B2 | 9/2012 | Or-Bach et al. | |
| 8,298,875 B1 | 10/2012 | Or-Bach et al. | |
| 8,332,803 B1 | 12/2012 | Rahman | |
| 8,450,804 B2 | 5/2013 | Sekar et al. | |
| 8,576,000 B2 | 11/2013 | Kim et al. | |
| 8,683,416 B1 | 3/2014 | Trivedi et al. | |
| 8,701,073 B1 | 4/2014 | Fu et al. | |
| 8,803,206 B1 | 8/2014 | Or-Bach et al. | |
| 8,803,233 B2 | 8/2014 | Cheng et al. | |
| 2004/0036126 A1 | 2/2004 | Chau et al. | |
| 2004/0113207 A1 | 6/2004 | Hsu et al. | |
| 2004/0241958 A1 | 12/2004 | Guarini et al. | |
| 2005/0280061 A1 | 12/2005 | Lee | |
| 2006/0190889 A1 | 8/2006 | Cong et al. | |
| 2007/0040221 A1 | 2/2007 | Gossner et al. | |
| 2007/0147157 A1* | 6/2007 | Luo et al. | 365/226 |
| 2007/0244676 A1 | 10/2007 | Shang et al. | |
| 2008/0276212 A1 | 11/2008 | Albrecht | |
| 2008/0283995 A1 | 11/2008 | Bucki et al. | |
| 2008/0291767 A1 | 11/2008 | Barnes et al. | |
| 2009/0174032 A1 | 7/2009 | Maejima et al. | |
| 2009/0302394 A1 | 12/2009 | Fujita | |
| 2010/0115477 A1 | 5/2010 | Albrecht et al. | |
| 2010/0140790 A1 | 6/2010 | Setiadi et al. | |
| 2010/0193770 A1 | 8/2010 | Bangsaruntip et al. | |
| 2010/0229142 A1 | 9/2010 | Masleid et al. | |
| 2010/0276662 A1 | 11/2010 | Colinge | |
| 2011/0049594 A1 | 3/2011 | Dyer et al. | |
| 2011/0053332 A1 | 3/2011 | Lee | |
| 2011/0059599 A1 | 3/2011 | Ward et al. | |
| 2011/0078222 A1* | 3/2011 | Wegener | 708/203 |
| 2011/0084314 A1 | 4/2011 | Or-Bach et al. | |
| 2011/0121366 A1 | 5/2011 | Or-Bach et al. | |
| 2011/0215300 A1 | 9/2011 | Guo et al. | |
| 2011/0221502 A1 | 9/2011 | Meijer et al. | |
| 2011/0222332 A1 | 9/2011 | Liaw et al. | |
| 2011/0253982 A1 | 10/2011 | Wang et al. | |
| 2011/0272788 A1 | 11/2011 | Kim et al. | |
| 2011/0280076 A1 | 11/2011 | Samachisa et al. | |
| 2011/0298021 A1 | 12/2011 | Tada et al. | |
| 2012/0012972 A1 | 1/2012 | Takafuji et al. | |
| 2012/0056258 A1 | 3/2012 | Chen | |
| 2012/0129276 A1 | 5/2012 | Haensch et al. | |
| 2012/0129301 A1* | 5/2012 | Or-Bach et al. | 438/129 |
| 2012/0152322 A1 | 6/2012 | Kribus et al. | |
| 2012/0171108 A1 | 7/2012 | Kim et al. | |
| 2012/0181508 A1 | 7/2012 | Chang et al. | |
| 2012/0187486 A1 | 7/2012 | Goto et al. | |
| 2012/0193621 A1 | 8/2012 | Or-Bach et al. | |
| 2012/0195136 A1* | 8/2012 | Yoko | 365/189.07 |
| 2012/0217479 A1 | 8/2012 | Chang et al. | |
| 2012/0280231 A1 | 11/2012 | Ito et al. | |
| 2012/0286822 A1 | 11/2012 | Madurawe | |
| 2012/0304142 A1 | 11/2012 | Morimoto et al. | |
| 2012/0305893 A1 | 12/2012 | Colinge | |
| 2012/0313227 A1 | 12/2012 | Or-Bach et al. | |
| 2013/0026539 A1 | 1/2013 | Tang et al. | |
| 2013/0026608 A1 | 1/2013 | Radu | |
| 2013/0105897 A1 | 5/2013 | Bangsaruntip et al. | |
| 2013/0148402 A1 | 6/2013 | Chang et al. | |
| 2013/0240828 A1 | 9/2013 | Ota et al. | |
| 2013/0299771 A1 | 11/2013 | Youn et al. | |
| 2014/0008606 A1 | 1/2014 | Hussain et al. | |
| 2014/0035041 A1* | 2/2014 | Pillarisetty et al. | 257/365 |
| 2014/0084444 A1 | 3/2014 | Lin | |
| 2014/0085959 A1 | 3/2014 | Saraswat et al. | |
| 2014/0097868 A1 | 4/2014 | Ngai | |
| 2014/0225218 A1 | 8/2014 | Du | |
| 2014/0225235 A1 | 8/2014 | Du | |

FOREIGN PATENT DOCUMENTS

| | | |
|---|---|---|
| FR | 2973938 A1 | 10/2012 |
| JP | H06204810 A | 7/1994 |
| JP | 2001160612 A | 6/2001 |
| KR | 20010109790 A | 12/2001 |
| KR | 20080038535 A | 5/2008 |
| WO | 2011112300 A1 | 9/2011 |
| WO | 2012113898 A1 | 8/2012 |
| WO | 2013045985 A1 | 4/2013 |

OTHER PUBLICATIONS

Co-pending U.S. Appl. No. 13/788,224, filed Mar. 7, 2013.
Co-pending U.S. Appl. No. 13/792,384, filed Mar. 11, 2013.
Co-pending U.S. Appl. No. 13/792,486, filed Mar. 11, 2013.
Co-pending U.S. Appl. No. 13/792,592, filed Mar. 11, 2013.
Fujio I. et al., "Level Conversion for Dual-Supply Systems", IEEE Transactions on Very Large Scale Integration (VLSI) Systems, vol. 12, No. 2, Feb. 2004, pp. 185-195.
Mototsugu H. et al., "A Top-Down Low Power Design Technique Using Clustered Voltage Scaling with Variable Supply-Voltage Scheme", IEEE 1998 Custom Integrated Circuits Conference, pp. 495-498.
Gong., et al., "Three Dimensional System Integration", Springer, IC Stacking Process and Design, Jan. 2011; IS8N 978-1-4419-0962-6; pp. 1-246.
Cong J. et al., "An Automated Design Flow for 3D Microarchitecture Evaluation," 11th Asia and South Pacific Design Automation Conference, Jan. 24, 2006, IEEE, pp. 384-389.

(56) References Cited

OTHER PUBLICATIONS

Friedman, E. G., "Clock Distribution Networks in Synchronous Digital Integrated Circuits," Proceedings of the IEEE, vol. 89, No. 5, May 2001, IEEE, pp. 665-692.
International Search Report for Patent Application No. PCT/US2014/022929, mailed Sep. 8, 2014, 10 pages.
Jain A. et al., "Thermal-electrical co-optimisation of floorplanning of three-dimensional integrated circuits under manufacturing and physical design constraints," IET Computers and Digital Techniques, vol. 5, No. 3, May 2011, IET, pp. 169-178.
Khan Q.A., et al., "A Single Supply Level Shifter for Multi-Voltage Systems," IEEE Proceedings of the 19th International Conference on VLSI Design (VLSID'06), Jan. 2006, IEEE, 4 pages.
Kim, T-Y., et al., "Clock Tree Synthesis for TSV-Based 3D IC designs," ACM Transactions on Design Automation of Electronic Systems, vol. 16, No. 4, Article 48, Oct. 2011, ACM, pp. 48:1-48:21.
Kulkarni J., et al., "Capacitive-Coupling Wordline Boosting with Self-Induced VCC Collapse for Write VMIN Reduction in 22-nm 8T SRAM," IEEE International Solid-State Circuits Conference, Feb. 2012, IEEE, pp. 234-236.
Lin, C-T., et al., "CAD Reference Flow for 3D Via-Last Integrated Circuits," 15th Asia and South Pacific Design Automation Conference (ASP-DAC), Jan. 2010, IEEE, pp. 187-192.
Lin S., et al., "A New Family of Sequential Elements with Built-in Soft Error Tolerance for Dual-VDD Systems," IEEE Transactions on Very Large Scale Integration (VLSI) Systems, vol. 16, No. 10, Oct. 2008, IEEE, pp. 1372-1384.
Loh, Gabriel H. et al., "Processor Design in 3D Die-Stacking Technologies," IEEE Micro, vol. 27, No. 3, May-Jun. 2007, IEEE, pp. 31-48.
Minz J. et al., "Block-Level 3-D Global Routing With an Application to 3-D Packaging", IEEE Transactions on Computer-Aided Design of Integrated Circuits and Systems, vol. 25, No. 10, Oct. 2006, IEEE, pp. 2248-2257.
Minz, J. et al., "Channel and Pin Assignment for Three Dimensional Packaging Routing," May 24, 2004, http://www.ceres.gatech.edu/tech-reports/tr2004/git-cercs-04-21.pdf, 6 pages.
Arunachalam V., et al., "Low-power clock distribution in microprocessor", Proceedings of the 18th ACM Great Lakes Symposium on VLSI , GLSVLSI '08, Jan. 1, 2008, 3 pages, XP055106715, New York, USA DOI: 10.1145/1366110.1366212 ISBN: 978-1-59-593999-9 p. 429-p. 434.
Donno M., et al., "Power-aware clock tree planning", Proceedings of the 2004 International Symposium on Physical Design, ISPD '04, Jan. 1, 2004, 5 pages, XP055106989, New York, New York, USA DOI: 10.1145/981066.981097 ISBN: 978-1-58-113817-7 p. 140-p. 144.
Ganguly S., et al., "Clock distribution design and verification for PowerPC microprocessors", Computer-Aided Design, 1997, Digest of Technical Papers., 1997 IEEE/ACM International Conference on San Jose, CA, USA Nov. 9-13, 1997, Los Alamitos, CA, USA, IEEE Comput. Soc, US, Nov. 5, 1995, pp. 58-61, XP032372227, DOI: 10.1109/ICCAD.1995.479991 ISBN: 978-0-8186-8200-1 p. 58-p. 61.
Tsao C.W.A., et al., "UST/DME: a clock tree router for general skew constraints", Computer Aided Design, 2000, ICCAD-2000, IEEE/ACM International Conference on, IEEE, Nov. 5, 2000, pp. 400-405, XP032402965, DOI: 10.1109/ICCAD.2000.896505 I: 978-0-7803-6445-5 p. 400-p. 401.
Xie J., et al., "CPDI: Cross-power-domain interface circuit design in monolithic 3D technology" , Quality Electronic Design (ISQED), 2013 14th International Symposium on, IEEE, Mar. 4, 2013, pp. 442-447, XP032418452, DOI: 10.1109/ISQED.2013.6523649 ISBN: 978-1-4673-4951-2 Section II. "Monolithic 3D Technology"; figures 1,3.
Bobba, S., et al., "Performance Analysis of 3-D Monolithic Integrated Circuits," 2010 IEEE International 3D Systems Integration Conference (3DIC), Nov. 16-18, 2010, Munich, Germany, IEEE, 4 pages.
Second Written Opinion for PCT/US2014/022929, mailed Mar. 20, 2015, 8 pages.
International Preliminary Report on Patentability for PCT/US2014/022929, mailed Jun. 24, 2015, 18 pages.

\* cited by examiner

THREE-DIMENSIONAL (3D) MEMORY CELL SEPARATION AMONG 3D INTEGRATED CIRCUIT (IC) TIERS, AND RELATED 3D INTEGRATED CIRCUITS (3DICS), 3DIC PROCESSOR CORES, AND METHODS

PRIORITY APPLICATION

The present application claims priority to U.S. Provisional Patent Application Ser. No. 61/800,220 filed on Mar. 15, 2013 and entitled "THREE-DIMENSIONAL (3D) MEMORY CELL SEPARATION AMONG 3D INTEGRATED CIRCUIT (IC) TIERS, AND RELATED 3D INTEGRATED CIRCUITS (3DICS), 3DIC PROCESSOR CORES, AND METHODS," which is incorporated herein by reference in its entirety.

BACKGROUND

I. Field of the Disclosure

The technology of the disclosure relates generally to three-dimensional (3D) integrated circuits (IC) (3DICs) and their use for processor cores, including central processing unit (CPU) cores and other digital processor cores.

II. Background

In processor-based architectures, memory structures are used for data storage. An example of a memory structure is a register. A register is a small amount of storage available as part of a processing unit, such as a central processing unit (CPU) or other digital processor. Registers are used for temporary storage of data as part of instruction executions by the arithmetic and logic unit (ALU). Registers have faster access times than main memory. Data from memory such as a cache memory is loaded into registers by operation of instructions to be used for performing arithmetic operations and manipulation. The manipulated data stored in a register is often stored back in main memory, either by the same instruction or a subsequent instruction.

A register file is an array of process registers in a processing unit. The register file plays a key role in processor operations, because it is usually the busiest storage unit in a processor-based system. Modern integrated circuit-based register files are usually implemented by way of fast static random access memories (SRAMs) with multiple ports. SRAM-based register files have dedicated read and write ports to provide for faster read and write access, whereas ordinary multi-ported SRAMs share read and write accesses through the same ports.

Register files have several characteristics that can affect their performance. For example, providing larger register files requires a large footprint area in an integrated circuit (IC). Larger footprint areas can increase register file access latency. Larger footprint areas can also increase peripheral logic areas and produce retiming arcs for other components placed around the register files. Multiple supply voltage rails may be used to provide sufficient voltage to avoid inadvertent flips in the stored bit due to insufficient static noise margins (SNMs) and read/write (RW) noise margins (RWNMs). If multiple power supply rails are provided inside the register file to be able to separately supply and lower supply voltage for SRAM read access ports, additional area in the IC will be required for the register file. Many of these issues are exacerbated in multi-core processing units such as are used in many conventional computers.

SUMMARY OF THE DISCLOSURE

Embodiments disclosed herein include three-dimensional (3D) memory cell separation among 3D integrated circuit (IC) (3DIC) tiers. Related 3DICs, 3DIC processor cores, and methods are also disclosed. In embodiments disclosed herein, memory read access ports of a memory block are separated from a memory cell in different tiers of a 3DIC. 3DICs achieve higher device packing density, lower interconnect delays, and lower costs. In this manner, different supply voltages can be provided for the read access ports and the memory cell to be able to lower supply voltage for the read access ports. Improved static noise margins (SNMs) and read/write (R/W) noise margins (RWNMs) in the memory cell may be provided as a result. Providing multiple power supply rails inside a non-separated memory block that increases area can also be avoided.

In this regard in one embodiment, a 3D memory block is disclosed. The 3D memory block comprises a memory cell disposed in a first tier of a 3DIC. The 3D memory block also comprises at least one read access port disposed in a second tier of the 3DIC, the at least one read access port is configured to provide read access to the memory cell. The 3D memory block also comprises at least one monolithic intertier via (MIV) coupling the at least one read access port to the memory cell.

In another embodiment, a 3D memory block is disclosed. The 3D memory block comprises a memory cell disposed in a first tier of a 3DIC. The 3D memory block also comprises at least one means for reading disposed in a second tier of the 3DIC, the at least one means for reading configured to provide read access to the memory cell. The 3D memory block also comprises at least one MIV coupling the at least one means for reading to the memory cell.

In another embodiment, a method of forming a 3D memory block is disclosed. The method includes forming a first tier of a 3DIC. The method also includes forming a memory cell within the first tier of the 3DIC. The method also includes forming a second tier of the 3DIC. The method also includes forming at least one read access port within a second tier of the 3DIC, the at least one read access port is configured to provide read access to the memory cell. The method also includes coupling the at least one read access port to the memory cell with at least one MIV.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include three-dimensional (3D) memory cell separation among 3D integrated circuit (IC) (3DIC) tiers. Related 3DICs, 3DIC processor cores, and methods are also disclosed. In embodiments disclosed herein, memory read access ports of a memory block are separated from a memory cell in different tiers of a 3DIC. 3DICs achieve higher device packing density, lower interconnect delays, and lower costs. In this manner, different supply voltages can be provided for the read access ports and the memory cell to be able to lower supply voltage for the read access ports. Static noise margins (SNMs) and read/write (R/W) noise margins (RWNMs) in the memory cell may be provided as a result. Providing multiple power supply rails inside a non-separated memory block that increases area can also be avoided.

Monolithic 3DIC offers additional degrees of freedom to reorganize logic systems for high density and low power designs. A register file, which is arguably the busiest storage unit, plays a crucial role connecting the logic operating units. The present disclosure provides a register file core cell design with either bit or bit bar (bitb) signal connected to transistors in at least two tiers of a 3DIC. In this design, the cell voltage, read access power supplies, and write access power supplies are decoupled to improve R/W margins and power consumption. The footprint of the register file can also be significantly reduced. While the present disclosure is well suited for use with register files, the present disclosure is also applicable to other memory devices such as cache memory or random access memory (RAM) and particularly to static RAM (SRAM). Collectively such memory types are referred to herein as a "memory block."

Before addressing the particulars of the multi-tier register in a 3DIC a brief overview of the elements of a register and how a register fits within a processing system is provided with reference to FIGS. 1A-3B. The discussion of the multi-tier register of the present disclosure begins with reference to FIG. 4.

Figure 1A:
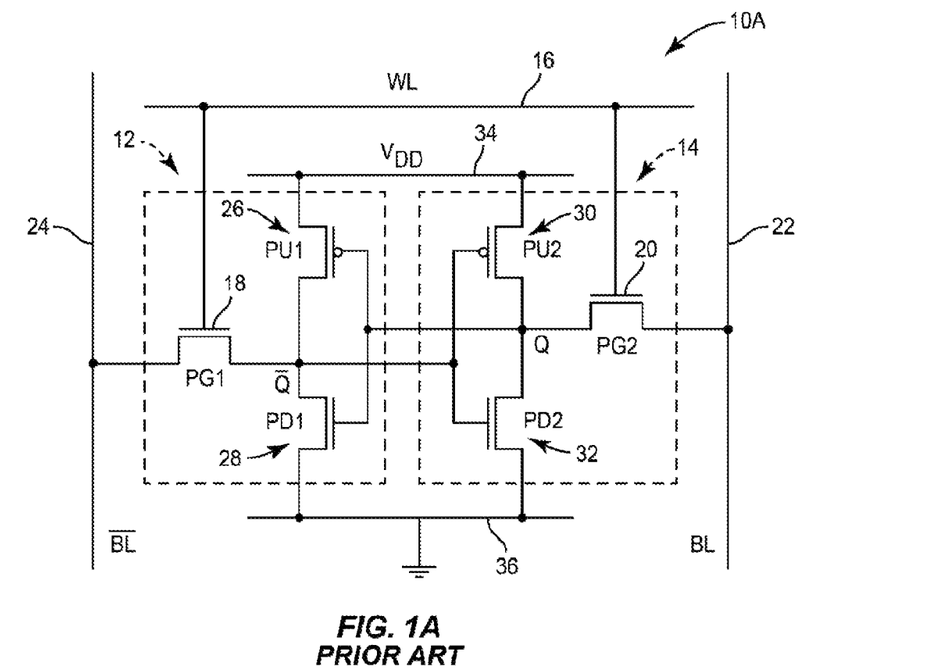
FIG. 1A is a block diagram of an exemplary conventional register file.

In this regard, FIG. 1A is a circuit diagram of an exemplary SRAM bit cell 10A having a first inverter 12 and a second inverter 14. A word line (WL) 16 couples to both inverters 12, 14. In particular, the WL 16 couples to the first inverter 12 through a gate of a first pass gate (PG) transistor 18 (PG1) and couples to the second inverter 14 through a gate of a second PG transistor 20 (PG2). A bit line 22 couples to a drain of the second PG transistor 20. A bit line bar 24 couples to a source of the first PG transistor 18.

With continued reference to FIG. 1A, the first inverter 12 includes a first pull up (PU) transistor 26 (PU1) and a first pull down (PD) transistor 28 (PD1). The second inverter 14 includes a second PU transistor 30 (PU2) and a second PD transistor 32 (PD2). A voltage source $V_{DD}$ 34 couples to the first and second PU transistors 26, 30. The PD transistors 28, 32 are coupled to ground 36.

Figure 1B:
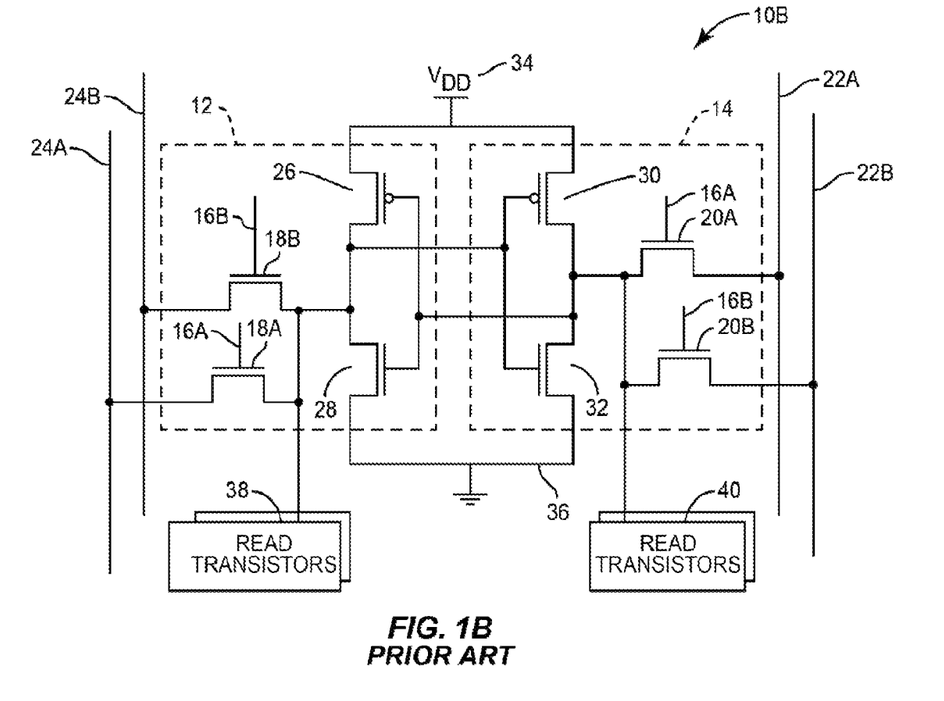
FIG. 1B is a block diagram of an exemplary conventional register file with multiple read and write ports.

While the SRAM bit cell 10A of FIG. 1A is used in many applications, one common variation on the SRAM bit cell 10A is a bit cell with multiple R/W ports. In this regard, FIG. 1B illustrates SRAM bit cell 10B with multiple R/W ports. A first bit line bar 24A couples to the source of a first first PG transistor 18A while a second bit line bar 24B couples to the source of a second first PG transistor 18B. The drains of the first PG transistors 18A, 18B share a common node coupled to the first inverter 12. Similarly, a first bit line 22A couples to the source of a first second PG transistor 20A and a second bit line 22B couples to the source of a second second PG transistor 20B. The drains of the second PG transistors 20A, 20B share a common node coupled to the second inverter 14. Multiple write lines 16A, 16B may be coupled to the PG transistors 18A, 18B, 20A, 20B. Additionally, first read transistors 38 may be coupled to the first inverter 12, and second read transistors 40 may be coupled to the second inverter 14. While only two bit lines and two bit line bar inputs are shown, it should be appreciated that more may be present with the appropriate PG transistor.

Figure 2:
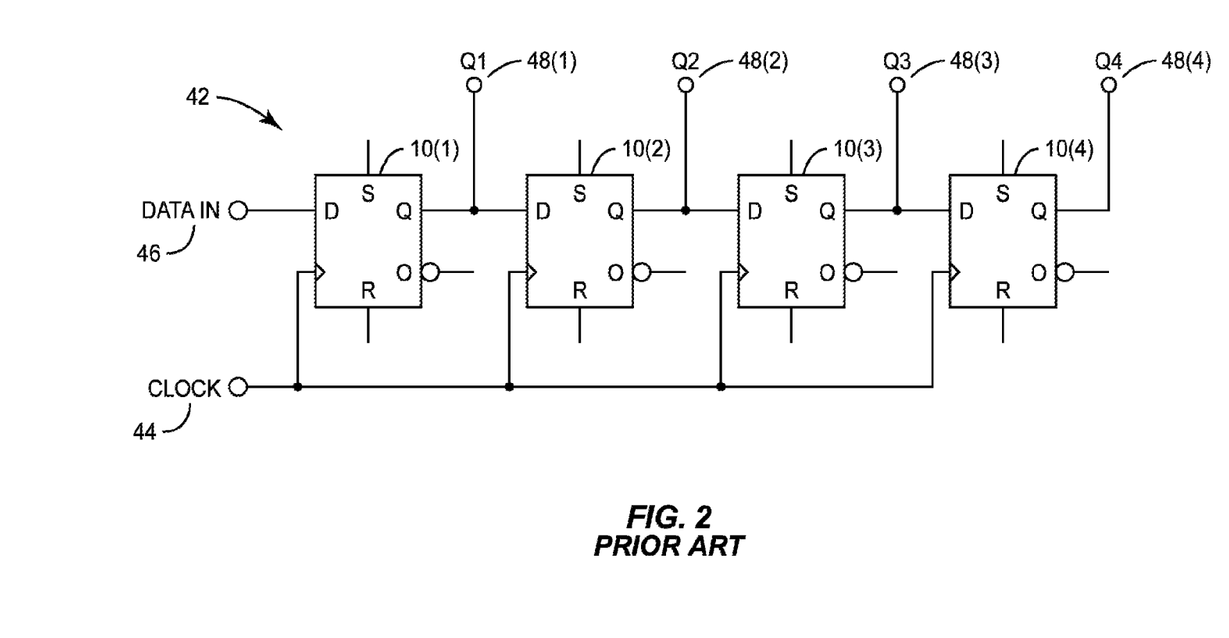
FIG. 2 is a simplified schematic of an exemplary conventional four bit register.

SRAM bit cells are, in essence, the fundamental building blocks of a register file and, as such, SRAM bit cells 10A, 10B may be assembled into a register such as a shift register 42 as illustrated in FIG. 2. Shift register 42 is a four bit shift register including four SRAM bit cells 10(1)-10(4). A clock signal 44 may be provided to each bit cell if desired. Data is initially provided on the data in line 46. Outputs 48(1)-48(4) are provided for respective bit cells 10(1)-10(4). While a four bit shift register 42 is illustrated, it should be appreciated that more bit cells may be assembled into larger registers. While a shift register is specifically illustrated, registers of various configurations are possible and all fall within the term "register file" as that term is used herein.

Registers serve a useful function in computing devices providing a memory block that is fast to access, and registers eliminate the need to access slower memory such as a hard drive. The registers may be associated with an arithmetic logic unit (ALU). Furthermore, unlike a cache memory which may effectively only be read by the processing core, registers may be both read and write allowing the ALU to store data being manipulated. Because of their heavy use, registers are frequently positioned within the same integrated circuit as the ALU as further illustrated in FIGS. 3A and 3B.

Figure 3A:
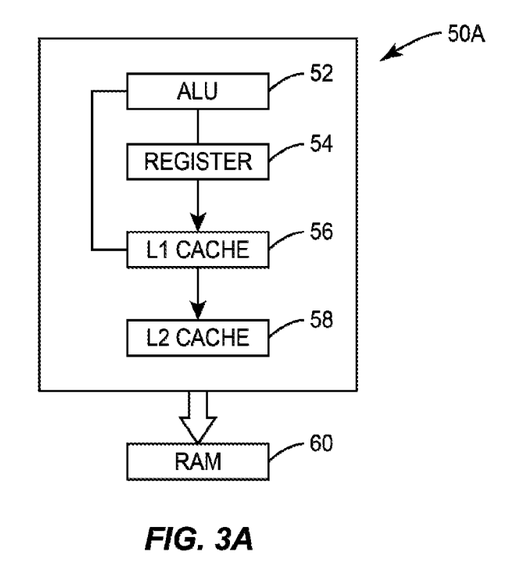
FIG. 3A is a simplified block diagram of an exemplary integrated circuit (IC) having a single core.

In this regard, FIG. 3A illustrates an exemplary IC 50A having a processing core that uses an ALU 52. The ALU 52 is associated with and communicates with a register 54 as well as a level one (L1) cache 56 and a level two (L2) cache 58. In an exemplary embodiment, the ALU 52 communicates with the L1 cache 56 through the register 54. In an alternate embodiment, the ALU 52 may communicate with the L1 cache 56 directly without passing through the register 54. The IC 50A may communicate with external memory devices such as a RAM 60. In the exemplary embodiment, the IC 50A has a single core and a single ALU 52, thus, the register 54 only serves the single ALU 52. However, some ICs may have a single core and multiple ALU (not shown). In such an embodiment, the registers may be coupled to the various ALU as is well understood. Furthermore, the computing industry increasingly relies on multi-core processors each with one or more ALU.

Figure 3B:
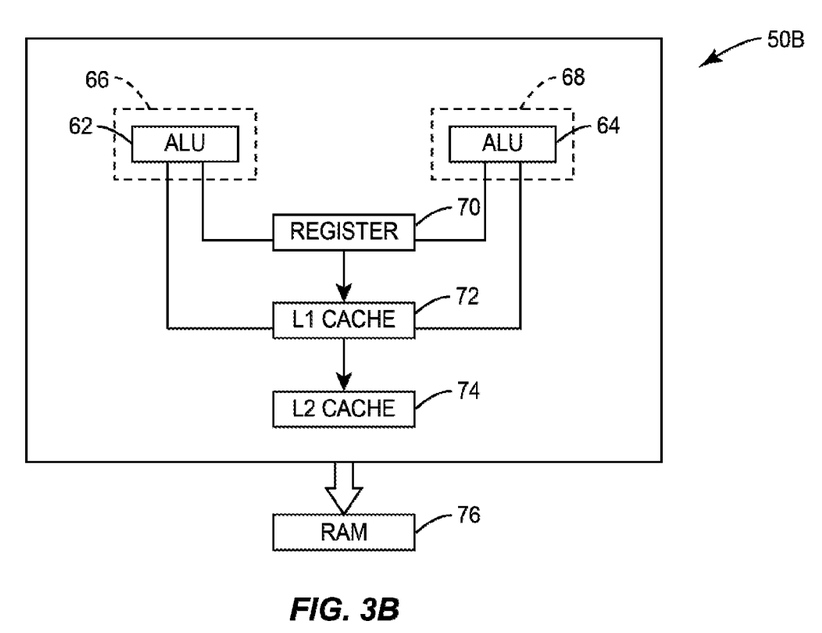
FIG. 3B is a simplified block diagram of an exemplary IC having multiple cores.

In this regard, FIG. 3B illustrates an exemplary IC 50B comprising a multi-core processor that uses a first ALU 62 within a first core 66 and a second ALU 64 within a second core 68. As noted above, the cores 66, 68 may have multiple ALU (not shown). The ALUs 62, 64 may cooperatively use a shared register 70, which may have one or more multi-port SRAM bitcells 10B to facilitate the shared usage. It should be appreciated that the ALUs 62, 64 may also have dedicated registers (not shown) which function for timing critical circuits associated with the particular ALU 62, 64. The ALUs 62, 64 may further use the L1 cache 72 and the L2 cache 74 as is well understood. As noted above, in an exemplary embodiment, the ALUs 62, 64, may communicate with the L1 cache 72 through the register 70. The IC 50B may further communicate with an external memory, such as RAM 76. While the discussion of FIGS. 1A-3B focuses on the use of SRAM bitcells in a register, it should be appreciated that other memory blocks such as the L1 or L2 cache or external RAM may also be formed from SRAM bitcells.

Against this general use of SRAM bit cells, it should be appreciated that current efforts to miniaturize ICs necessitate ever increasing demands on space use within an IC, such as ICs 50A, 50B. Additionally, as memory demands increase in multi-thread processors, the size of SRAM based register files increases. The larger the register, the more latency occurs during register file access. Further, as the number of bit cells increases, the peripheral logic area increases and may produce retiming arcs for other components placed around the register file. In addition to miniaturization concerns, there is increasing concern about power consumption, which reduces $V_{DD}$ for the bit cells. If $V_{DD}$ becomes too small, the SNM and RWNM become limiting factors and can be optimized by separating the power supplies of read and write operations. Routing the conductive paths for each voltage source then becomes a further bottleneck for a low power system and having multiple power supply rails inside the register file leads to a further area penalty. As is readily understood, these problems synergistically feed one another causing difficulties for circuit designers.

The present disclosure remedies the deficiencies of the current state of the art by providing a register file core cell design with different elements of the register file spread across multiple tiers of a 3DIC. By splitting the register file across the tiers of the 3DIC the routing for the various power rails and access lines is simplified and the overall footprint of the register is reduced. Reduction of the footprint reduces latency and reduces the likelihood of retiming arcs.

Figure 4:
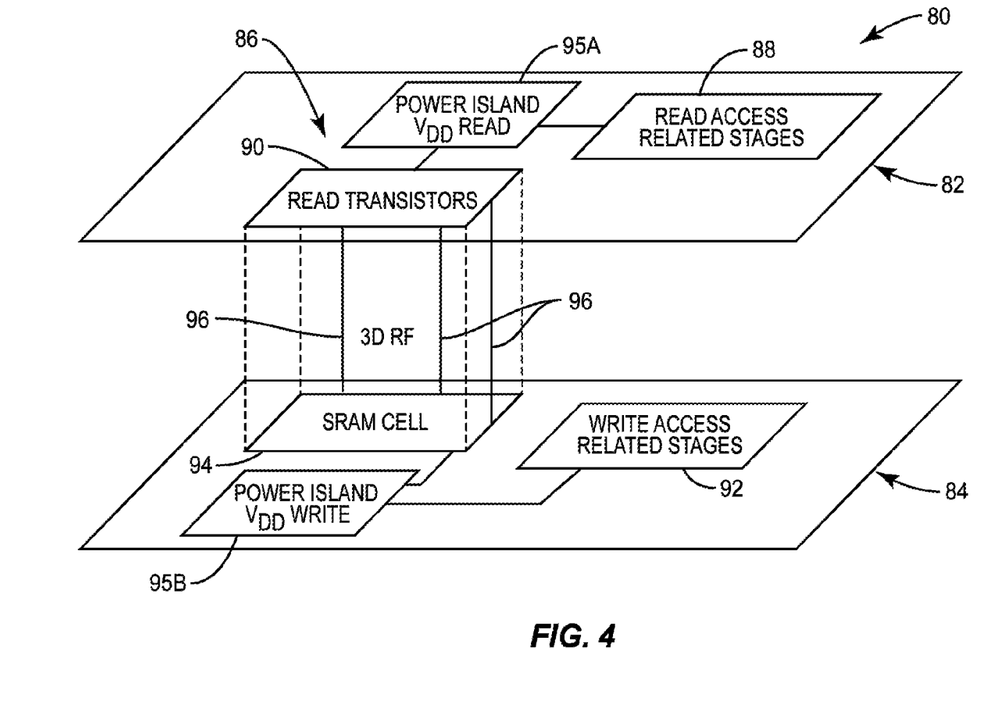
FIG. 4 is a simplified block diagram of an exemplary monolithic three dimensional (3D) IC (3DIC) with a register spread across multiple tiers of the 3DIC.

In this regard, FIG. 4 illustrates a 3DIC 80 having a first tier 82 and a second tier 84 with a register file 86 spread across the first tier 82 and the second tier 84. In the illustrated embodiment of FIG. 4, the read access related stages 88 (including a processor core read logic and a read access port configured to provide read access) and the read transistors 90 are positioned in the first tier 82 while the write access related stages 92 (including a processor core write logic and a write access port configured to provide write access) and the inverters of the SRAM cell 94 are positioned in the second tier 84, thereby positioning the memory cell portion of the register file 86 in the second tier 84. The read transistors 90 communicate with the inverters of the SRAM cell 94. In an exemplary embodiment, the read transistors 90 are coupled to the SRAM cell 94 with one or more monolithic intertier vias (MIV) 96. By splitting the register file 86 across multiple tiers 82, 84 of the 3DIC 80, the overall footprint of the register file 86 is reduced compared to a two dimensional register file. Furthermore, by separating the read transistors 90 from the SRAM cell 94, routing issues relating to routing voltage rails and the multiple access ports are eased. Thus, as illustrated a first power island 95A is provided on the first tier 82 and provides $V_{DD_{READ}}$ to the appropriate elements within the read transistors 90 and the read access related stages 88. Likewise, a second power island 95B is provided on the second tier 84 and provides $V_{DD_{WRITE}}$ to the appropriate elements within the SRAM cell 94 and write access related stages 92. The inclusion of separate voltage rails helps mitigate the SNM such that inadvertent flips of the memory bit are avoided. Note that the typical SRAM cell 94 is approximately 0.1 to 0.09 square microns. A typical through silicon via (TSV) has a diameter of about 5 microns—i.e., much larger than the SRAM cell 94. MIV 96 are much smaller than a TSV, being approximately 0.05 microns and thus the use of MIV 96 instead of TSV preserves the footprint savings of splitting the register file 86 across the multiple tiers 82, 84. As used herein a means for reading is used to designate the read access port and equivalents. Likewise, as used herein, a means for writing is used to designate the write access port and equivalents.

The concept of the MIV was published in a paper entitled "High-Density Integration of Functional Modules Using Monolithic 3D-IC Technology" by Shreedpad Panth et al. in the proceedings of the IEEE/ACM Asia South Pacific Design Automation Conference, 2013; pp. 681-686 which is hereby incorporated by reference.

While FIG. 4 illustrates the write access related stages 92 on the second tier 84, in another exemplary embodiment, the write access related stages 92 may be on the first tier 82. If the write access related stages 92 are on the first tier 82, then MIVs 96 may be used to couple the write access related stages 92 to the SRAM cell 94.

Figure 5:
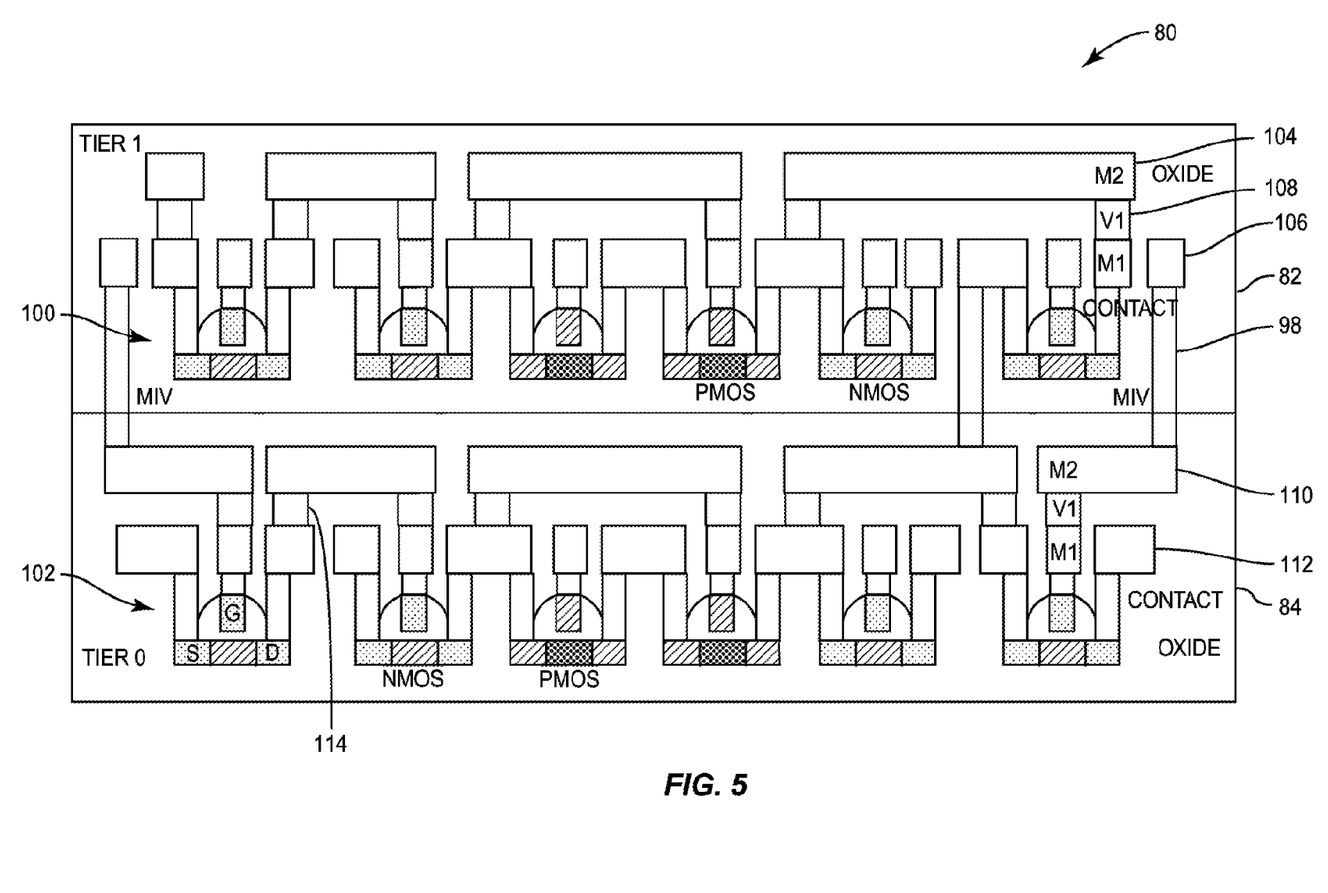
FIG. 5 is a cross-sectional view of an exemplary 3DIC having a register spread across multiple tiers of the 3DIC.

FIG. 5 illustrates a cross-sectional view of the 3DIC 80 with first tier 82 and second tier 84 coupled with MIV 98. Elements 100 are positioned within the first tier 82 including one or more transistors, which may be PMOS or NMOS transistors. Elements 102 are positioned within the second tier 84 including one or more transistors, which may likewise be PMOS or NMOS transistors. The elements 100 may include one or more metal layers 104, 106 coupled by vias 108. The elements 102 may include one or more metal layers 110, 112 coupled by vias 114. The metal layers 104, 106, 110, 112 provide horizontal interconnections and facilitating conductive routing paths within the 3DIC. The small MTV size, which is about the same size of conventional interconnect via, creates a very high density of inter-tier connections, making separation of read and write ports to different tiers possible and economically viable.

The multi-tier register file 86 is particularly well suited for multi-core processors. That is, the multi-tier register file 86 may be shared between cores of a multi-core processor such as multi-core IC 50B shown schematically in FIG. 3B, and allows the cores to be positioned on different tiers within the 3DIC 80. Such flexibility in positioning assists designers in routing conductive paths, reducing latency and otherwise improving performance of the multi-core processors.

The register files in the 3DICs according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
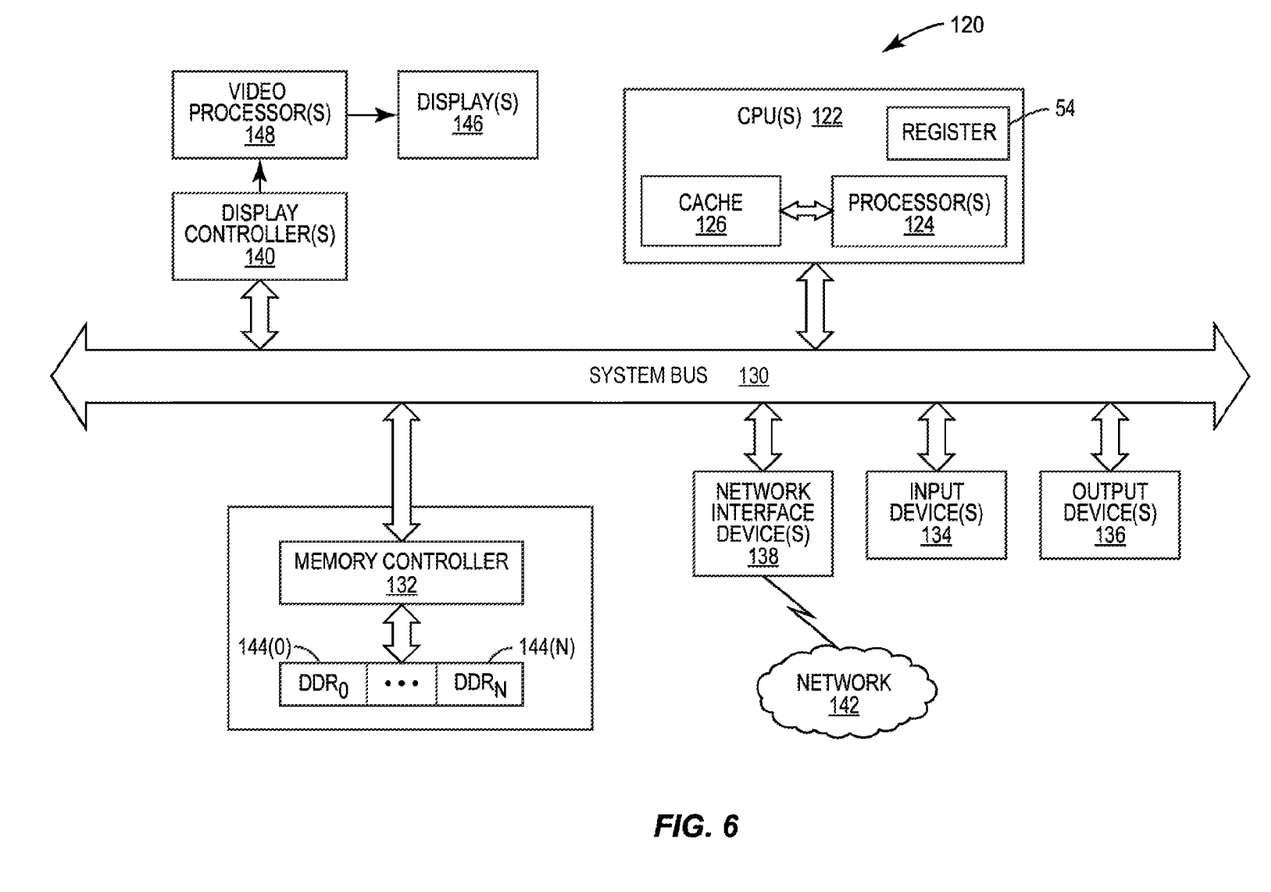
FIG. 6 is a block diagram of an exemplary processor-based system that can include the register of FIG. 4 or 5.

In this regard, FIG. 6 illustrates an example of a processor-based system 120 that can employ the register files in the 3DIC illustrated in FIGS. 4 and 5. In this example, the processor-based system 120 includes one or more central processing units (CPUs) 122, each including one or more processors 124. The CPU(s) 122 may include a register 54 and/or may be a master device. The CPU(s) 122 may have cache memory 126 coupled to the processor(s) 124 for rapid access to temporarily stored data. The CPU(s) 122 is coupled to a system bus 130 and can intercouple master devices and slave devices included in the processor-based system 120. As is well known, the CPU(s) 122 communicates with these other devices by exchanging address, control, and data information over the system bus 130. For example, the CPU(s) 122 can communicate bus transaction requests to the memory controller 132 as an example of a slave device. Although not illustrated in FIG. 6, multiple system buses 130 could be provided, wherein each system bus 130 constitutes a different fabric.

Other master and slave devices can be connected to the system bus 130. As illustrated in FIG. 6, these devices can include a memory controller 132, one or more input devices 134, one or more output devices 136, one or more network interface devices 138, and one or more display controllers 140, as examples. The input device(s) 134 can include any type of input device, including but not limited to input keys, switches, voice processors, etc. The output device(s) 136 can include any type of output device, including but not limited to audio, video, other visual indicators, etc. The network interface device(s) 138 can be any devices configured to allow exchange of data to and from a network 142. The network 142 can be any type of network, including but not limited to a wired or wireless network, private or public network, a local area network (LAN), a wide local area network (WLAN), and the Internet. The network interface device(s) 138 can be configured to support any type of communication protocol desired. The memory controller 132 can include one or more memory units 144 (0-N).

The CPU(s) 122 may also be configured to access the display controller(s) 140 over the system bus 130 to control information sent to one or more displays 146. The display controller(s) 140 sends information to the display(s) 146 to be displayed via one or more video processors 148, which process the information to be displayed into a format suitable for the display(s) 146. The display(s) 146 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) memory block, comprising:
    a memory cell comprising a static random access memory (SRAM), the memory cell disposed in a first tier of a 3D integrated circuit (IC) (3DIC);
    at least one read access port disposed in a second tier of the 3DIC, the at least one read access port configured to provide read access to the memory cell, wherein each read access port of the at least one read access port comprises a first read transistor coupled to a first inverter of the SRAM and a second read transistor coupled to a second inverter of the SRAM; and
    at least one monolithic intertier via (MIV) coupling the at least one read access port to the memory cell.

2. The 3D memory block of claim 1, further comprising at least one write access port disposed in the first tier of the 3DIC, the at least one write access port configured to provide write access to the memory cell.

3. The 3D memory block of claim 1, further comprising at least one write access port disposed in the second tier of the 3DIC, the at least one write access port configured to provide write access to the memory cell through the at least one MIV.

4. The 3D memory block of claim 1, further comprising:
a processor core write logic disposed in the first tier of the 3DIC, the processor core write logic configured to provide write requests to at least one write port of the memory cell; and
a processor core read logic disposed in the second tier of the 3DIC, the processor core read logic configured to provide read accesses to the at least one read access port of the memory cell.

5. The 3D memory block of claim 1, further comprising:
a first voltage rail supplied with a first voltage disposed in the first tier of the 3DIC, the first voltage rail configured to supply the first voltage to the memory cell; and
a second voltage rail supplied with a second voltage lower than the first voltage supplied to the first voltage rail, the second voltage rail disposed in the second tier of the 3DIC and configured to supply the second voltage to the at least one read access port.

6. The 3D memory block of claim 1 integrated into a semiconductor die.

7. The 3D memory block of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the 3D memory block is integrated.

8. The 3D memory block of claim 1, wherein the 3D memory block comprises a register within an integrated circuit.

9. The 3D memory block of claim 1, wherein the 3D memory block comprises cache memory within an integrated circuit.

10. A three-dimensional (3D) memory block, comprising:
a memory cell comprising a static random access memory (SRAM), the memory cell disposed in a first tier of a 3D integrated circuit (IC) (3DIC);
at least one means for reading disposed in a second tier of the 3DIC, the at least one means for reading configured to provide read access to the memory cell, wherein each means for reading of the at least one means for reading comprises a first read transistor coupled to a first inverter of the SRAM and a second read transistor coupled to a second inverter of the SRAM; and
at least one monolithic intertier via (MIV) coupling the at least one means for reading to the memory cell.

11. The 3D memory block of claim 10, further comprising at least one means for writing disposed in the first tier of the 3DIC, the at least one means for writing configured to provide write access to the memory cell.

12. A method of forming a three-dimensional (3D) memory block, comprising:
forming a first tier of a 3D integrated circuit (IC) (3DIC);
forming a memory cell comprising a static random access memory (SRAM) within the memory cell within the first tier of the 3DIC;
forming a second tier of the 3DIC;
forming at least one read access port within the second tier of the 3DIC, the at least one read access port configured to provide read access to the memory cell, wherein forming the at least one read access port comprises:
forming a first read transistor coupled to a first inverter of the SRAM; and
forming a second read transistor coupled to a second inverter of the SRAM; and
coupling the at least one read access port to the memory cell with at least one monolithic intertier via (MIV).

13. The method of claim 12, further comprising forming at least one write access port within the first tier of the 3DIC, the at least one write access port configured to provide write access to the memory cell.

14. The method of claim 12, further comprising configuring the memory cell to operate as a register.

15. The method of claim 12, further comprising forming at least one write access port within the second tier of the 3DIC, the at least one write access port configured to provide write access to the memory cell through the at least one MIV.

16. The method of claim 12, further comprising:
forming a processor core write logic within the first tier of the 3DIC, the processor core write logic configured to provide write requests to at least one write port of the memory cell; and
forming a processor core read logic within the second tier of the 3DIC, the processor core read logic configured to provide read accesses to the at least one read access port of the memory cell.

17. The method of claim 12, further comprising:
forming a first voltage rail within the first tier of the 3DIC, the first voltage rail configured to supply a first voltage to the memory cell; and
forming a second voltage rail within the second tier of the 3DIC, the second voltage rail configured to supply a second voltage to the at least one read access port.

* * * * *